(12) United States Patent
Tan et al.

(10) Patent No.: US 11,420,361 B2
(45) Date of Patent: Aug. 23, 2022

(54) IMPRINT TEMPLATE, METHOD OF FABRICATING IMPRINT TEMPLATE, APPARATUS FOR PERFORMING METHOD OF FABRICATING IMPRINT TEMPLATE, IMPRINT MOLD FOR FABRICATING AN IMPRINT TEMPLATE

(71) Applicant: BOE TECHNOLOGY GROUP CO., LTD., Beijing (CN)

(72) Inventors: Wei Tan, Beijing (CN); Xin Gu, Beijing (CN); Kang Guo, Beijing (CN); Zhen Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 453 days.

(21) Appl. No.: 16/484,572

(22) PCT Filed: Apr. 17, 2019

(86) PCT No.: PCT/CN2019/083037
§ 371 (c)(1),
(2) Date: Aug. 8, 2019

(87) PCT Pub. No.: WO2020/073632
PCT Pub. Date: Apr. 16, 2020

(65) Prior Publication Data
US 2022/0001580 A1    Jan. 6, 2022

(30) Foreign Application Priority Data
Oct. 11, 2018    (CN) .......................... 201811185524.7

(51) Int. Cl.
*B29C 33/38*    (2006.01)
(52) U.S. Cl.
CPC .................. *B29C 33/3842* (2013.01)

(58) Field of Classification Search
CPC .................. B29C 33/3842; G03F 7/0002
See application file for complete search history.

(56) References Cited

U.S. PATENT DOCUMENTS 6,391,217 B2 * 5/2002 Schaffer .............. B82Y 40/00
216/41
2003/0178316 A1   9/2003 Jacobs et al.
(Continued)

FOREIGN PATENT DOCUMENTS

CN    1678443 A    10/2005
CN    1729428 A    2/2006
(Continued)

OTHER PUBLICATIONS

Office Action dated Dec. 9, 2019, issued in counterpart CN Application No. 201811185524.7, with English translation (21 pages).
(Continued)

*Primary Examiner* — Michael M. Robinson
*Assistant Examiner* — Victoria Bartlett
(74) *Attorney, Agent, or Firm* — WHDA, LLP

(57) ABSTRACT

The present disclosure generally relates to nanostructure manufacturing. A method for fabricating an imprint template includes providing a first substrate including a first electrode layer on a first base layer and a plurality of first convex portions on a surface of the first electrode layer; providing a second substrate including a second electrode layer on a second base layer, a second resist layer on the second electrode layer, and a plurality of second convex portions on a surface of the second resist layer farthest from the second base layer, supplying electrical signals to the first electrode layer and the second electrode layer to produce an electric field between the plurality of first convex portions and the plurality of second convex portions; and forming the imprint template on the second substrate.

15 Claims, 13 Drawing Sheets

(56) References Cited

U.S. PATENT DOCUMENTS

| | | | |
|---|---|---|---|
| 2014/0162436 A1 | 6/2014 | Rolandi et al. | |
| 2014/0209565 A1* | 7/2014 | Nakamura | B29C 33/58 |
| | | | 216/41 |
| 2014/0315002 A1* | 10/2014 | Gaudl | C09D 11/103 |
| | | | 428/195.1 |
| 2017/0285479 A1* | 10/2017 | Stachowiak | G03F 7/0002 |

FOREIGN PATENT DOCUMENTS

| | | | |
|---|---|---|---|
| CN | 101446762 A | | 6/2009 |
| CN | 102566262 A | | 7/2012 |
| CN | 102910579 A | | 2/2013 |
| CN | 103064137 A | | 4/2013 |
| CN | 103086319 A | | 5/2013 |
| CN | 103149607 A | | 6/2013 |
| CN | 103159164 A | | 6/2013 |
| CN | 103159164 B | * | 8/2015 |
| CN | 109188862 A | | 1/2019 |
| EP | 1251974 A2 | | 10/2002 |
| WO | WO-2004063815 A2 * | 7/2004 | ........... G03F 7/0002 |

OTHER PUBLICATIONS

International Search Report dated Jun. 27, 2019, issued in Application No. PCT/CN2019/083037 (13 pages).

* cited by examiner

IMPRINT TEMPLATE, METHOD OF FABRICATING IMPRINT TEMPLATE, APPARATUS FOR PERFORMING METHOD OF FABRICATING IMPRINT TEMPLATE, IMPRINT MOLD FOR FABRICATING AN IMPRINT TEMPLATE

CROSS-REFERENCE TO RELATED APPLICATIONS

This application claims benefit of the filing date of Chinese Patent Application No. 201811185524.7 filed on Oct. 11, 2018, the disclosure of which is hereby incorporated in its entirety by reference.

TECHNICAL FIELD

The present disclosure generally relates to nanostructure manufacturing and its applications in fields such as display technology and sensing or biosensing technology, and more particularly, to an imprint template, a method of fabricating an imprint template, an apparatus for performing a method of fabricating an imprint template, and an imprint mold for fabricating an imprint template.

BACKGROUND

Nanoimprint lithography (NIL) is a patterning technology that offers ultrahigh resolution, high throughput, high fidelity, and low cost. It is considered one of the most promising nanolithography techniques, and has broad applications in areas such as displays and sensors or biosensors.

BRIEF SUMMARY

An embodiment of the present disclosure is a method for fabricating an imprint template. The method may comprise providing a first substrate comprising a first electrode layer on a first base layer and a plurality of first convex portions on a surface of the first electrode layer; providing a second substrate comprising a second electrode layer on a second base layer, a second resist layer on the second electrode layer, and a plurality of second convex portions on a surface of the second resist layer farthest from the second base layer; supplying electrical signals to the first electrode layer and the second electrode layer to produce an electric field between the plurality of first convex portions and the plurality of second convex portions; and forming the imprint template on the second substrate. In at least some embodiments, the plurality of first convex portions may be positioned to face the plurality of second convex portions. In at least some embodiments, each of the plurality of first convex portions may be aligned with a corresponding one of the plurality of second convex portions. In at least some embodiments, the plurality of first convex portions and the plurality of second convex portions may be spaced apart by a predetermined distance.

In at least some embodiments, before the supplying of electrical signals to the first electrode layer and the second electrode layer to produce the electric field between the plurality of first convex portions and the plurality of second convex portions, the plurality of first convex portions may be spaced apart from the plurality of second convex portions.

In at least some embodiments, the method may comprise, during the forming of the imprint template, elongating each of the plurality of second convex portions to extend toward a corresponding one of the plurality of first convex portions and contacting with a surface of the corresponding one of the plurality of first convex portion.

In at least some embodiments, the plurality of first convex portions may be positioned to overlap entirely with the plurality of second convex portions.

In at least some embodiments, the second resist layer may comprise a resist material having a rheological property.

In at least some embodiments, the second resist layer may comprise an ultraviolet-curable resist material, a photoinitiator, and an additive.

In at least some embodiments, the ultraviolet-curable resist material may comprise at least one of an acrylate-based resin and an epoxy-based resin. In at least some embodiments, the photoinitiator may comprise a metal. In at least some embodiments, a content of the photoinitiator may be from 0.3 to 1% by weight of the ultraviolet-curable resist material.

In at least some embodiments, each of the first base layer and the second base layer may comprise a rigid or semi-rigid transparent material.

In at least some embodiments, the method may further comprise supplying the electrical signals until the plurality of first convex portions and the plurality of second convex portions contact each other, and then curing the plurality of second convex portions.

In at least some embodiments, the providing of the second substrate may comprise forming the second electrode layer on the second base layer, applying a layer of resist material on the second electrode layer, and patterning and curing the layer of resist material to form the second resist layer.

In at least some embodiments, the providing of the first substrate may comprise: forming the first electrode layer on the first base layer, patterning the first electrode layer to form a plurality of electrode blocks, and forming the plurality of first convex portions on the plurality of electrode blocks so that each of the plurality of first convex portions corresponds to one of the plurality of electrode blocks.

In at least some embodiments, the providing of the first substrate may comprise: forming a first electrode layer on the first base layer; forming a dielectric layer on the first electrode layer; forming a first resist layer on the dielectric layer; forming a plurality of third convex portions on a surface of the first resist layer; forming the plurality of first convex portions in the dielectric layer using the plurality of third convex portions as a mask; and removing the first resist layer and the plurality of third convex portions.

In at least some embodiments, the method may further comprise forming a first intermediate layer on the second electrode layer before applying the layer of resist material. In at least some embodiments, the first intermediate layer may comprise a primer material. In at least embodiments, the first intermediate layer may have a thickness of 5 nm to 10 nm.

In at least some embodiments, the electrical signals may be supplied as direct current voltage of from 5 V to 100 V.

In at least some embodiments, the method may further comprise separating the second substrate comprising the imprint template formed thereon from the first substrate.

Another embodiment of the present disclosure is an imprint template obtained by a method as described above.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

Figure 1:
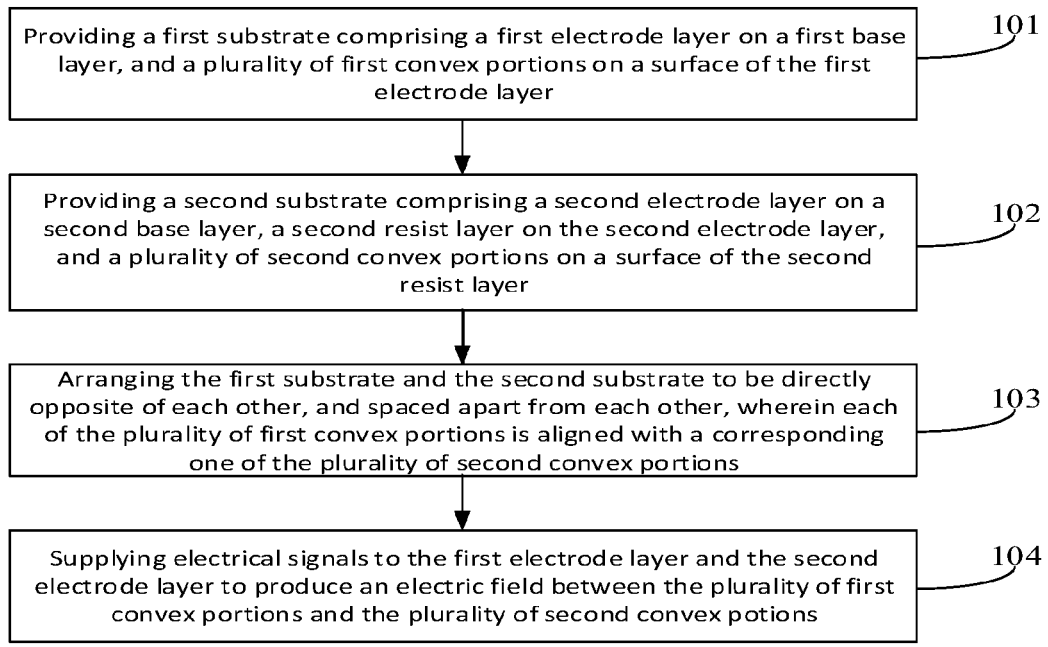
FIG. 1 shows a flow chart of a method of fabricating an imprint template according to an embodiment of the present disclosure.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it will be understood that other similar embodiments may be used, or modifications and additions may be made to the described embodiments for performing the same function of the present technology without departing from the spirit and scope of the present disclosure. Therefore, the present technology should not be limited to any single embodiment, but rather, should be construed in breadth and scope in accordance with the appended claims. In addition, all other embodiments obtained by a person of ordinary skill in the art based on embodiments described in the present disclosure are considered to be within the scope of this disclosure.

It will be understood that although the terms "first", "second", "third" etc. may be used in the present disclosure to describe various steps and/or elements, these steps and/or elements should not be limited by those terms. Those terms are only used to distinguish one step and/or element from another step and/or element, but are not used to define only the step and/or element itself or to mean a particular sequence. Thus, a "first" step or element in some embodiments could be termed a "second" step or element in other embodiments without departing from the spirit and scope of the present disclosure.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Nanoimprint lithography (NIL) is a patterning technology that offers ultrahigh resolution, high throughput, high fidelity, and low cost. It is considered one of the most promising nanolithography techniques, and has broad applications in areas such as displays, sensors, biosensors, and medical devices. For example, in display technologies, NIL may be used to manufacture the film layers in the display panel. However, before NIL could be performed, a stamp or template needs to be prepared.

Conventional NIL has utilized the roll-to-plate or plate-to-plate technique to imprint patterns onto a substrate, which correspond to predefined patterns on a master mold. More particularly, a stamp is prepared by coating a thin layer of imprintable material (normally, a resist composition) on a substrate. An imprint master mold with a predefined surface pattern is pressed into the thin layer of imprintable material under certain pressure. The thin layer-mold sandwich is then cured. Once the thin layer is cured, the mold is removed to produce a multilayer structure having an imprint pattern (i.e, the template).

However, conventional nanoimprint technologies suffer certain drawbacks. For one, air can seep into spaces in the imprint mold, so that during the imprint process, air gaps exist between the mold and the imprintable material. These air gaps prevent a tight fit between the mold and the imprintable material, which in turn prevents the imprintable material from completely filling in the compressions in the pattern of the mold. The imprint pattern thus produced can be shorter than the desired height (for example, corresponding to the depth of the compressions in the pattern of the mold). This reduces precision. In addition, imprintable material residues are often left on the substrate to prevent direct contact between the mold and the substrate. This is intended to protect and prolong the lifespan of the mold.

However, after the mold has been removed, the imprint template must then be subject to additional etching processes, such as inductively coupled plasma (ICP) etching, to clear the residues. This reduces productivity.

The present disclosure aims to address these drawbacks in conventional nanoimprint technologies. In at least some embodiments of the present disclosure, a first substrate and a second substrate are provided. The first substrate comprises a first electrode layer on a first base layer, and a plurality of first convex portions on a surface of the first electrode layer. The second substrate comprises a second electrode layer on a second base layer, and a second resist layer on the second electrode layer. A plurality of second convex portions are formed on the second resist layer. The first substrate and the second substrate are arranged to be directly opposite of each other, and the plurality of first convex portions and the plurality of second convex portions face each other. The first and second substrates are aligned so that the plurality of first convex portions are aligned with the plurality of second convex portions. The plurality of first convex portions and the plurality of second convex portions are spaced apart by a predetermined distance. Electric signals supplied to each of the first electrode layer and the second electrode layer causes electric fields to be generated between the first and second convex portions. The second resist layer is composed of a material having theological properties, so that the electric fields are able to induce the elongation of the plurality of second convex portions on the second resist layer toward the plurality of first convex portions, so as to produce a flow-induced imprint template on the second substrate. As compared to conventional nanoimprint technologies, the present disclosure utilizes a flow-induced structure formation process to produce the pattern. The precision of the pattern produced by the flow-induced structure formation process does not depend on the closeness of fit between the mold and the imprintable substrate. As a result, the present disclosure makes it possible to minimize, even eliminate, the effects of a mold's dimensions and geometry on the structure or integrity of the imprint pattern. This in turn can increase the precision and accuracy of the imprint pattern.

FIG. 1 shows a flow chart of a method of fabricating an imprint template according to an embodiment of the present disclosure.

In step 101, a first base layer is provided. A first electrode layer and a plurality of first convex portions are formed on the first base layer.

The first base layer may be a transparent layer. The first base layer may comprise a rigid or semi-rigid material that is non-metallic and that is capable of transmitting light. Suitable materials for forming the first base layer include, but are not limited to, glass, quartz, transparent resin, and the like.

In step 102, a second base layer is provided. A second electrode layer is provided on the second base layer, and a second resist layer is provided on the second electrode layer. A plurality of second convex portions are formed on a surface of the second resist layer that is farthest from the second base layer.

The plurality of second convex portions on the second resist layer are positioned to correspond to the plurality of first convex portions on the first electrode layer. Each of the plurality of second convex portions are formed on the second resist layer corresponds in position to one of the plurality of first convex portions on the first electrode layer. More particularly, the plurality of second convex portions are formed on the second resist layer at the same intervals as the plurality of first convex portions on the first electrode layer.

The second base layer may be a transparent layer. The second base layer may be composed of a rigid or semi-rigid material that is non-metallic and that is capable of transmitting light. Suitable materials for forming the second base layer include, but are not limited to, glass, quartz, transparent resin, and the like.

In step 103, the first substrate and the second substrate are arranged to be directly opposite of each other. More particularly, the first substrate and the second substrate are positioned so that the plurality of first convex portions are aligned with the plurality of second convex portions. In some embodiments, the plurality of first convex portions are positioned to overlap entirely the plurality of second convex portions. The orthographic projections of the plurality of first convex portions on the first base layer overlap entirely with the orthographic projections of the plurality of second convex portions on the second base layer. The plurality of first convex portions and the plurality of second convex portions are spaced apart by a predetermined distance. The distance separating the first and second convex portions is not particularly limited, and may be determined based on factors such as the dimensions of the imprint patterns to be formed. The plurality of first convex portions and the plurality of second convex portions may be separated by a distance of 200 nm to 200 μm.

In step 104, electrical signals are supplied to each of the first electrode layer and the second electrode layer, so as to produce electric fields between the plurality of first convex portions and the plurality of second convex portions. The electric fields between the first and second convex portions are non-uniform. The second resist layer comprises a material having theological properties. Under the effect of the electric fields, the plurality of second convex portions on the second resist layer of the second substrate elongate to extend toward a corresponding one of the plurality of first convex portions and contact with a surface of the corresponding one of the plurality of first convex portions.

This results in a flow-induced imprint pattern on the second substrate. In some embodiments, before the supplying of the electric signals to the first electrode layer and the second electrode layer to produce the electric fields between the plurality of first convex portions and the plurality of second convex portions, the plurality of first convex portions are spaced apart from the plurality of second convex portions.

As compared to conventional nanoimprint technologies, the present disclosure utilizes a flow-induced formation process to produce the imprint pattern. The precision of the imprint pattern produced by the flow-induced formation process does not depend on the closeness of fit between the mold and the imprintable substrate. As a result, the present disclosure makes it possible to minimize, even eliminate, the effects of a mold's dimensions and geometry on the structure and integrity of the imprint pattern. This in turn can increase the precision and accuracy of the imprint pattern.

Figure 2:
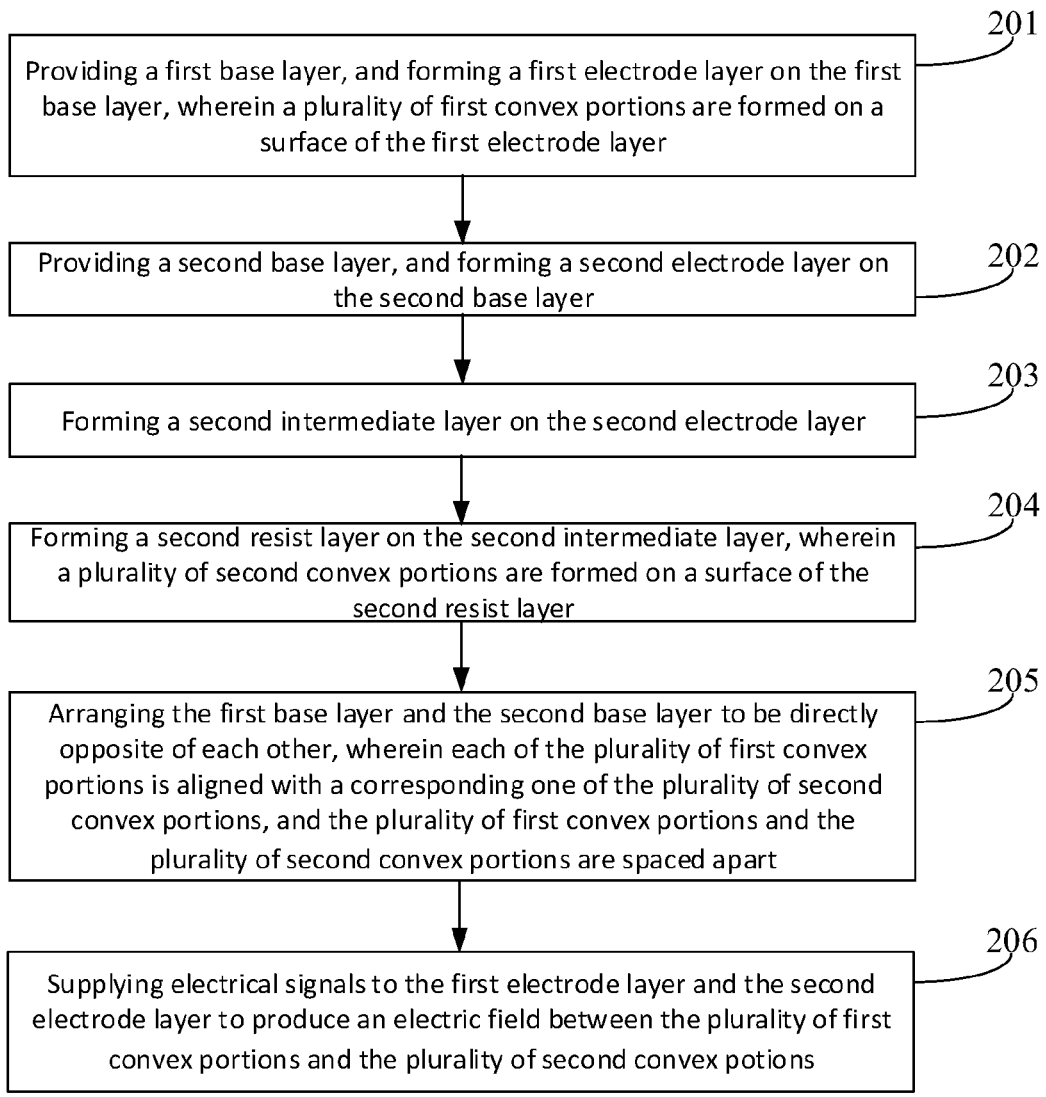
FIG. 2 shows a flow chart of a method of fabricating an imprint template according to another embodiment of the present disclosure.

FIG. 2 shows a flow chart of a method of fabricating an imprint template according to another embodiment of the present disclosure.

In step 201, a first base layer is provided. A first electrode layer is provided on the first base layer, and a dielectric layer is provided on the first electrode layer. A plurality of first convex portions are formed on a surface of the dielectric layer that is farthest from the first base layer.

The processes for forming the first base layer, first electrode layer, and dielectric layer are not particularly limited. The first base layer, first electrode layer, and dielectric layer may be formed by ally suitable process known to a person of ordinary skill in the art.

Figure 3:
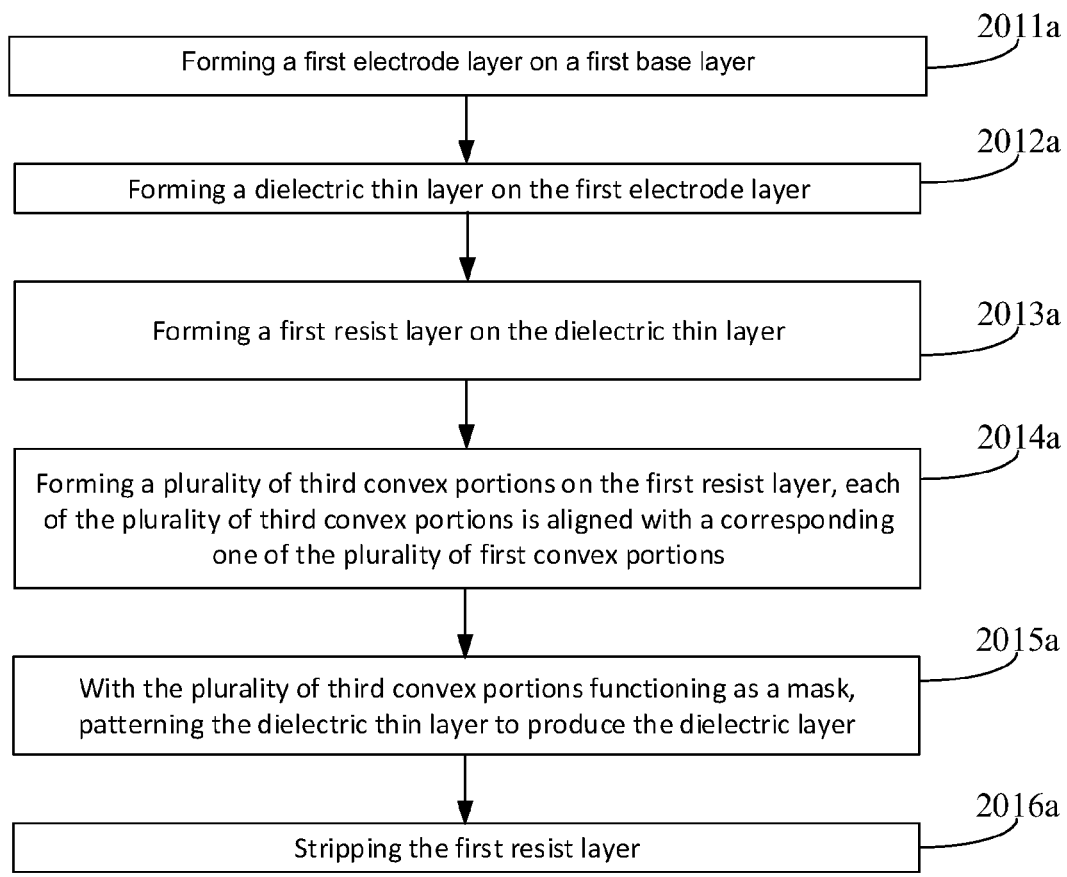
FIG. 3 shows a flow chart of a method of forming a first electrode layer and a dielectric layer on the first substrate according to an embodiment of the present disclosure.

In at least some embodiments, the first base layer, first electrode layer, and dielectric layer may be formed as shown in FIG. 3.

More particularly, as shown in FIG. 3, in step 2011a, a first electrode layer is formed on the first base layer.

In some embodiments, the first electrode layer is formed as a continuous layer. For example, the first electrode layer may be a planar electrode with a smooth surface. A plurality of fourth convex portions are formed on a surface of the first electrode layer that is farthest from the first base layer. The plurality of fourth convex portions correspond to the plurality of second convex portions of the second substrate. Each of the plurality of fourth convex portions on the first electrode layer corresponds in position to one of the plurality of second convex portions on the second substrate.

In some embodiments, the first electrode layer comprises a plurality of electrode blocks. The plurality of electrode blocks correspond to the plurality of second convex portions on the second substrate. Each of the plurality of electrode blocks of the first electrode layer corresponds in position to one of the plurality of second convex portions.

When the first electrode layer is formed with the plurality of fourth convex portions, the first electrode layer does not have a uniform thickness. When electrical signals are supplied to the first and second electrode layers, the strength of an electric field generated between the first and second electrode layers at any given position may be directly proportional to the thickness of the first electrode layer and/or the second electrode layer at that given position. The first electrode layer is thicker at positions corresponding to the fourth convex portions, and the electric fields are therefore stronger between the fourth convex portions and the second electrode layer. The first electrode layer is thinner at positions that do not correspond to a convex portion, and at those positions, the electric fields between the first and second electrode layers are weaker. Since the plurality of fourth convex portions are arranged to align with the plurality of second convex portions, the stronger electric fields between the convex portions induce the second convex portions to deform and flow toward the first electrode layer, so as to form an imprint pattern on the second substrate. More particularly, the electric fields induce the materials forming the second convex portions to flow along the direction of the electric fields, and this flow of materials causes "deformations" in the second convex portions, namely, elongations of the second convex portions along the direction of the electric fields.

When the first electrode layer is formed with a plurality of electrode blocks, electrical signals are supplied to each of the plurality of electrode blocks. Since the plurality of electrode blocks are positioned to align with the plurality of second convex portions, supplying the electrical signals to the first and second electrode layers causes electric fields to form between each of the electrode blocks and the corresponding second convex portion. No electric fields can be formed between the first and second electrode layers at positions where no electrode blocks are formed on the first electrode layer. This differential in electric field strengths can enhance the flow-induced formation of the imprint pattern on the second substrate.

To form the first electrode layer, a first conductive material is deposited on the first base layer until a layer of a certain thickness is obtained. The thickness of the layer of first conductive material is not particularly limited, and may be any suitable thickness depending on need. The first conductive material may be deposited by any suitable process known to a person of ordinary skill in the art, such as magnetron sputtering, thermal evaporation, and plasma enhanced chemical vapor deposition (PECVD).

In embodiments where the first electrode layer is patterned, after depositing the layer of first conductive material, the deposited layer may be subject to a patterning step to produce the patterned first electrode layer. The patterning step may comprise applying a layer of photoresist material, and then exposing, developing, etching, and stripping the photoresist material.

The first conductive material is a transparent material, and includes, but is not limited to, a metal such as aluminum and copper; or a metal oxide such as indium tin oxide (ITO) and indium zinc oxide (IZO).

In step 2012a, after the first electrode layer is formed on the first base layer, a dielectric thin layer is formed on the first electrode layer.

To form the dielectric thin layer, a dielectric material is deposited on the first base layer until a layer of a certain thickness is obtained. The dielectric material may be deposited by any suitable process known to a person of ordinary skill in the art, such as magnetron sputtering, thermal evaporation, and plasma enhanced chemical vapor deposition (PECVD). The thickness of the dielectric thin layer is not particularly limited, and may be any suitable thickness depending on need.

In step 2013a, after the dielectric thin layer is forced on the first electrode layer, a first resist layer is formed on the dielectric thin layer.

To form the first resist layer, a resist material may be coated onto the first base layer on which the dielectric thin layer is formed. The thickness of the first resist layer is not particularly limited, and may be any suitable thickness depending on need. The composition of the resist material is not particularly limited, and may be any suitable resist material known to a person of ordinary skill in the art, including, but not limited to, polymethyl methacrylate (PMMA), polydimethylsiloxane (PMDS), acrylate resin, and epoxy resin. The viscosity of the resist material is not particularly limited, and may be any suitable viscosity depending on need. For example, in some embodiments, the first resist layer may have a thickness of 3 μm, and the viscosity of the resist material may be 300 cP.

In some embodiments, a first intermediate layer is formed between the dielectric thin layer and the first resist layer. The dielectric thin layer, the first intermediate layer, and the first resist layer are arranged in a stack.

To form the first intermediate layer, a layer of the appropriate layer-forming material is applied on the first base layer by a suitable process such as spin coating or inkjet printing. The first intermediate layer is configured to promote adhesion between the dielectric thin layer and the first resist layer, in order to improve the stability of the first resist layer on the dielectric thin layer.

To ensure that the first intermediate layer has the appropriate adhesiveness, the material for forming the first intermediate layer may have a viscosity greater than a predetermined threshold level. The material for forming the first intermediate layer is not particularly limited. For example, the first intermediate layer may comprise any suitable primer known to a person of ordinary skill in the art, so long as the primer is capable of providing adhesion. The thickness of the first intermediate layer is not particularly limited, and may be any suitable thickness depending on need. For example, in some embodiments, the first intermediate layer may have a thickness of from 5 nm to 10 nm.

Figure 4:
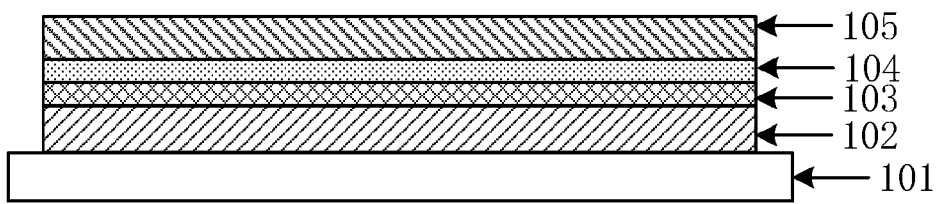
FIG. 4 shows a schematic diagram of a first substrate according to an embodiment of the present disclosure, which first substrate has a first resist layer formed thereon.

FIG. 4 shows a schematic diagram of a first substrate according to an embodiment of the present disclosure, which first substrate comprises a first resist layer.

As shown in FIG. 4, the first electrode layer 102, the dielectric thin layer 103, the first intermediate layer 104, and the first resist layer 105 are arranged in this order in a stack on the first base layer 101.

In step 2014a, a plurality of third convex portions are formed on the first resist layer. The plurality of third convex portions correspond to the plurality of first convex portions. Each of the plurality of third convex portions corresponds in position to one of the plurality of first convex portions.

Figure 5:
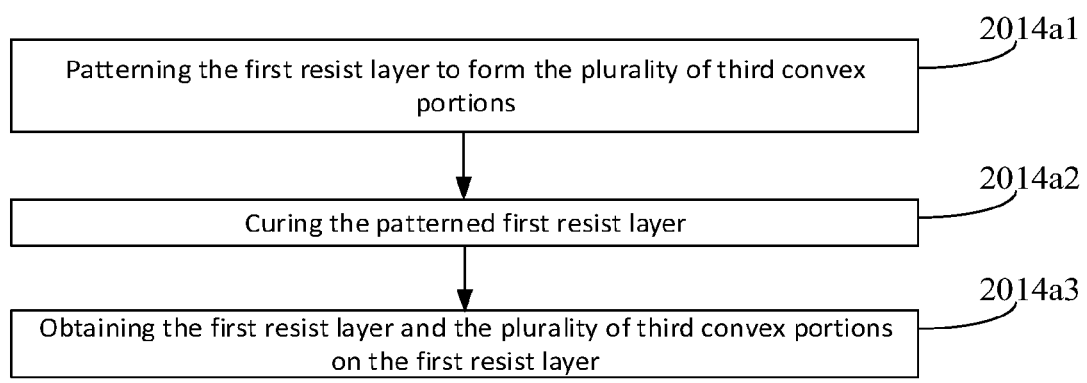
FIG. 5 shows a flow chart of a method of forming a first resist layer according to an embodiment of the present disclosure.

FIG. 5 shows a flow chart of a method of forming a first resist layer according to an embodiment of the present disclosure.

In step 2014a1, the first resist layer is patterned, for example, by an imprint mold, to form the plurality of third convex portions.

More particularly, after the first resist layer is formed, the first resist layer may be heated to a temperature above the glass transition temperature of the resist material. At that temperature, the resist material becomes a viscous liquid and can flow, and can therefore be readily deformed into the shape of the mold. Once the first resist layer is heated to the appropriate temperature, the mold is pressed into the first resist layer to form the plurality of third convex portions. The pattern on the mold is complementary to the pattern of the plurality of third convex portions. The pattern on the mold may be formed by any suitable means known to a person of ordinary skill in the art, including, but not limited to, laser interference. The mold may be composed of any suitable material known to a person of ordinary skill in the art, including, but not limited to, nickel (Ni).

In step 2014a2, the patterned first resist layer is cured.

The patterned first resist layer may be cured via ultraviolet (UV) curing or thermal curing. During UV curing, the imprinted first resist layer is irradiated with high-intensity UV light, which initiates photochemical reactions that generate crosslinks in the imprinted first resist layer. Thermal curing cures the imprinted first resist layer via heat-induced crosslinking reactions, in embodiments where UV curing is used, the first electrode layer, the dielectric thin layer, and the first intermediate layer may comprise a transparent material, and the first resist layer may comprise a UV-curable resist material. This can facilitate the transmission of UV light through the first electrode layer, the dielectric thin layer, and the first intermediate layer to reach the first resist layer. For example, the first electrode layer may be composed of a transparent material such as indium tin oxide (ITO), and the first resist layer may comprise a UV-curable resist such as acrylate or urethane acrylate.

In step 2014a3, the mold is removed, and the first resist layer and the plurality of third convex portions are obtained.

Figure 6:
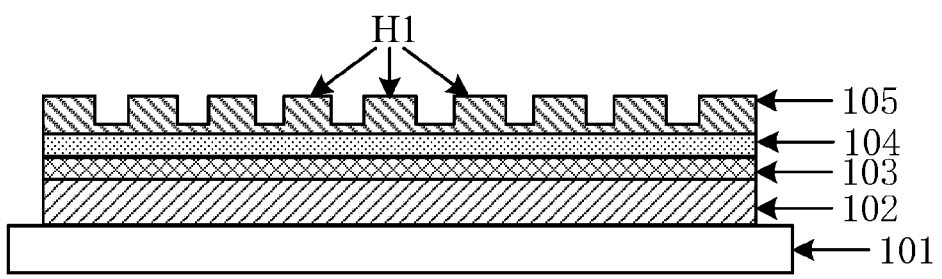
FIG. 6 shows a schematic diagram of a first substrate according to an embodiment of the present disclosure, which first substrate has a first resist layer formed thereon.

FIG. 6 shows a schematic diagram of a first substrate according to an embodiment of the present disclosure, which first substrate comprises a first resist layer.

As shown in FIG. 6, the first electrode layer 102, the dielectric thin layer 103, the first intermediate layer 104, and the first resist layer 105 are arranged in this order in a stack on the first base layer 101. A plurality of third convex portions H1 are formed on the first resist layer 105.

In step 2015a, the plurality of third convex portions on the first resist layer function as a mask, and through the first resist layer, the dielectric thin layer is patterned to produce the dielectric layer.

More particularly, using the first resist layer and the plurality of third convex portions as a mask, the dielectric thin layer may be patterned (for example, by etching) to produce the dielectric layer having the desired pattern. The dielectric thin layer may be etched by a wet etch process or a dry etch process. In some embodiments, the dry etch process is preferred because of improved control of etch directionality, which can contribute to higher precision in the imprint pattern. Any suitable dry etch process (for example, inductively coupled plasma (JCP) etching) known to a person of ordinary skill in the art may be used.

In step 2016a, the first resist layer is stripped.

In some embodiments, the first resist layer is stripped by plasma etching using oxygen-based plasmas. The first resist layer comprises a resist material, which reacts with oxygen plasmas to produce gas. As such, during step 2016a, the first resist layer may be stripped by injecting oxygen plasma into a reaction chamber to induce reactions between the first resist layer and the oxygen plasma, and in the process, strip the first resist layer.

In embodiments where the first intermediate layer is provided between the dielectric thin layer and the first resist layer, the first intermediate layer must also be stripped (for example, after step 2016a) to obtain the dielectric layer. The first intermediate layer may be stripped by any suitable process known to a person of ordinary skill in the art, including, but not limited to, ashing.

Figure 7:
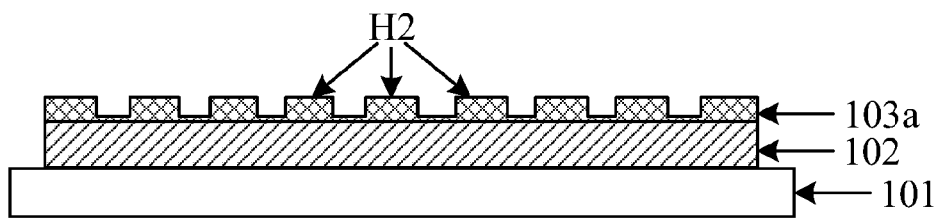
FIG. 7 shows a schematic diagram of a first substrate according to an embodiment of the present disclosure, which first substrate has a dielectric layer formed thereon.

FIG. 7 shows a schematic diagram of a first substrate according to an embodiment of the present disclosure, which first substrate has a dielectric layer formed thereon. More particularly, FIG. 7 shows a dielectric layer 103a after the dielectric thin layer 103 (for example, as illustrated in FIG. 6) is patterned, and the first resist layer 105 and the first intermediate layer 104 are removed.

As shown in FIG. 7, the dielectric layer 103a is formed with a plurality of first convex portions H2 on a side opposite from the first base layer 101. FIGS. 6 and 7 together show that the pattern of the plurality of first convex portions H2 corresponds to the pattern of the plurality of third convex portions H1.

In embodiments where the first electrode layer is formed with a plurality of fourth convex portions, or the first electrode layer comprises a plurality of electrode blocks, it may not be necessary to form the dielectric layer with the plurality of first convex portions. In those embodiments, steps 2013a to 2016a may be omitted. In those embodiments, different portions of the first electrode layer already have different thicknesses, which may be sufficient to produce electric fields of varying strengths and ensure that the second convex portions on the second resist layer will undergo flow-induced deformation to produce the desired imprint pattern on the second substrate.

As described above, in step 201, a first base layer is provided. A first electrode layer is provided on the first base layer, and a dielectric layer is provided on the first electrode layer. A plurality of first convex portions are formed on the surface of the dielectric layer that is farthest from the first base layer.

The process for forming the first base layer, first electrode layer, and dielectric layer is not particularly limited. The first base layer, first electrode layer, and dielectric layer may be formed by any suitable process known to a person of ordinary skill in the art.

Figure 8:
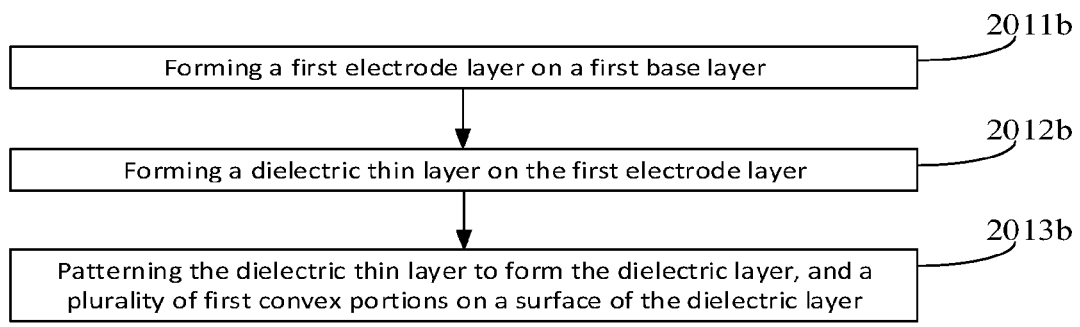
FIG. 8 shows a flow chart of a method of forming a first electrode layer and a dielectric layer on the first substrate according to another embodiment of the present disclosure.

In at least some embodiments, the first base layer, first electrode layer, and dielectric layer may be formed as shown in FIG. 8.

More particularly, as shown in FIG. 8, in step 2011b, a first electrode layer is formed on the first base layer.

In some embodiments, the first electrode layer may be formed as a continuous layer. For example, the first electrode layer may be a planar electrode with a smooth surface. In some embodiments, a surface of the first electrode layer may be formed with a plurality of fourth convex portions. The pattern of the plurality of fourth convex portions corresponds to the pattern of the plurality of second convex portions on the second substrate. Each of the plurality of fourth convex portions corresponds in position to one of the plurality of second convex portions on the second substrate.

In some embodiments, the first electrode layer comprises a plurality of electrode blocks. The pattern of the plurality of electrode blocks corresponds to the pattern of the plurality of second convex portions. Each of the electrode blocks on the first substrate corresponds in position to one of the plurality of second convex portions.

When the first electrode layer is formed with the plurality of fourth convex portions, the first electrode layer does not have a uniform thickness. When electrical signals are supplied to the first and second electrode layers, the strength of an electric field generated between the first and second electrode layers at any given position is directly proportional to the thickness of the first electrode layer and/or the second electrode layer at that particular given position. The first electrode layer is thicker at positions corresponding to the fourth convex portions, and the electric fields are therefore stronger between the fourth convex portions and the second electrode layer. The first electrode layer is thinner at positions that do not correspond to a convex portion, and at those positions, the electric fields between the first and second electrode layers are weaker. Since the fourth convex portions are arranged to align with the second convex portions, the stronger electric fields between the convex portions induce the second convex portions to deform and flow toward the first electrode layer, so as to form an imprint pattern on the second substrate. More particularly, the materials forming the second convex portions have theological properties, so that the electric fields are able to induce the materials to deform and flow along a direction of the electric fields. This flow of materials causes "deformations" in the second convex portions, namely, extensions of the second convex portions along the direction of the electric fields.

When the first electrode layer is formed with a plurality of electrode blocks, the electrical signals are supplied to each of the plurality of electrode blocks. Since the electrode blocks are arranged to align with the second convex portions, supplying the electrical signals to the first and second electrode layers causes electric fields to form between each electrode block and the corresponding second convex portion. No electric fields can be formed between the first and second electrode layers at positions where no electrode blocks are formed on the first electrode layer. This differential in electric field strengths can enhance the flow-induced formation of the imprint pattern on the second substrate.

To form the first electrode layer, a first conductive material is deposited on the first base layer until a layer of a certain thickness is obtained. The first conductive material may be deposited by any suitable processes known to a person of ordinary skill in the art, such as magnetron sputtering, thermal evaporation, and plasma enhanced chemical vapor deposition (PECVD). The thickness of the layer of first conductive material is not particularly limited, and may be any suitable thickness depending on need.

In embodiments where the first electrode layer is patterned, after depositing the layer of first conductive material, the deposited layer may be subject to a patterning step to produce the patterned first electrode layer. The patterning step may comprise applying a layer of photoresist material, and then exposing, developing, etching, and stripping the photoresist material.

The first conductive material is a transparent material, and includes, but is not limited to, a metal such as aluminum and copper; or a metal oxide such as indium tin oxide (ITO) and indium zinc oxide (IZO).

In step 2012b, a dielectric thin layer is formed on the first electrode layer.

To form the dielectric thin layer, a dielectric material is deposited on the first substrate until a layer of a certain thickness is obtained. The dielectric material may be deposited by any suitable processes known to a person of ordinary skill in the art, such as magnetron sputtering, thermal evaporation, and plasma enhanced chemical vapor deposition (PECVD). The thickness of the dielectric thin layer is not particularly limited, and may be any suitable thickness depending on need.

In step 2013b, the dielectric thin layer is patterned to form the dielectric layer, which comprises a plurality of first convex portions on a surface of the dielectric layer that is farthest from the first base layer.

The dielectric thin layer may be subject to a patterning step to produce the dielectric layer. The patterning step may comprise applying a layer of resist material, and then exposing, developing, etching, and stripping the resist material.

In step 202, a second electrode layer is formed on the second base layer.

The second electrode layer may be formed in a similar manner as the first electrode layer (for example, in step 2011a). The first electrode layer and the second electrode layer may comprise the same or different materials. In some embodiments, the first and second electrode layers may both comprise a metal such as aluminum and copper; or a metal oxide such as indium tin oxide (ITO) and indium zinc oxide (IZO). In some embodiments, the first electrode layer may comprise one of a metal and a metal oxide, and the second electrode layer may comprise the other one of a metal and metal oxide.

In step 203, the second intermediate layer is formed on the second electrode layer.

To form the second intermediate layer, a layer of the appropriate layer-forming material may be applied on the second base layer by a suitable process such as spin coating or inkjet printing. The second intermediate layer is configured to promote adhesion between the second electrode layer and the second resist layer, in order to improve the stability of the second resist layer on the second electrode layer.

To ensure that the second intermediate layer has the appropriate adhesiveness, the material for forming the second intermediate layer may have a viscosity greater than a predetermined threshold level. The material for forming the second intermediate layer is not particularly limited. For example, the second intermediate layer may comprise any suitable primer known to a person of ordinary skill in the art, so long as the primer is capable of providing adhesion. The thickness of the second intermediate layer is not particularly limited, and may be any suitable thickness depending on need. For example, in some embodiments, the second intermediate layer may have a thickness of 5 nm.

In step 204, the second resist layer is formed on the second intermediate layer.

A plurality of second convex portions are formed in a surface of the second resist layer that is farthest from the second base layer. The pattern of the second convex portions corresponds to the pattern of the first convex portions. Each of the second convex portions is aligned with one of the first convex portions. Each of the second convex portions corresponds in position to one of the first convex portions. In some embodiments, the plurality of first convex portions overlap entirely with the plurality of second convex portions. The orthographic projections of the first convex portions on the second layer overlap lap entirely with the orthographic projections of the second convex portions on the second base layer. The thickness of the second resist layer is not particularly limited, and may be any suitable thickness depending on need. For example, in some embodiments, the second resist layer may have a thickness of at least 100 nm.

To form the second resist layer, a layer of resist material is coated onto the second base layer, and then patterned and cured to form the second resist layer. The resist material may be deposited by any suitable processes known to a person of ordinary skill in the art, such as magnetron sputtering, thermal evaporation, and plasma enhanced chemical vapor deposition (PECVD).

In some embodiments, the second resist layer may be formed by an imprint technique. After the layer of resist material is coated onto the second base layer, and while the resist material is still in an uncured state, an imprint mold is pressed into the layer of resist material to form the second resist layer and the plurality of second convex portions on the surface of the resist layer farthest from the second base layer. More particularly, after coating the layer of resist material, the resist material may be heated to a temperature above its glass transition temperature. At that temperature, the resist material becomes a viscous liquid and can flow, and can therefore be readily deformed into the shape of the imprint mold. Once the resist material is heated to the appropriate temperature, the imprint mold is pressed into the resist material to form the plurality of second convex portions. The pattern on the imprint mold is complementary to the pattern of the plurality of second convex portions. The pattern on the imprint mold may be formed by any suitable means known to a person of ordinary skill in the art, including, but not limited to, laser interference. The imprint mold may be composed of any suitable material known to a person of ordinary skill in the art, including, but not limited to, nickel (Ni).

The patterned layer of resist material is then cured to form the second resist layer.

Curing may be performed via ultraviolet (UV) curing or thermal curing. During UV curing, the patterned layer of resist material is irradiated with high-intensity UV light, which initiates photochemical reactions that generate cross-links in the resist material. Thermal curing cures the patterned layer of resist material via heat-induced crosslinking reactions. In embodiments where UV curing is used, the second electrode layer and the second intermediate layer may comprise a transparent material, and the resist material may comprise a UV-curable resist material. This can facilitate the transmission of UV light through the second electrode layer and the second intermediate layer to reach the second resist layer.

After curing, the mold is removed, and the second resist layer is obtained.

In some embodiments, the second resist layer may be formed by directly molding the resist material. For example, the resist material may be deposited onto the second base layer in the desired pattern corresponding to the plurality of second convex portions. The resist material may be deposited via such techniques as blade coating, precision printing, and inkjet printing. The resist material is cured to produce the plurality of second convex portions on the second substrate. The second resist layer is thus obtained. In some embodiments where inkjet printing is used to deposit the resist material, the intervals between the second convex portions may be adjusted by adjusting the intervals at which ink id deposited and/or the concentration of the ink. In those embodiments, the height of the second convex portions may be adjusted by adjusting the layers of ink deposited on the second intermediate layer.

The resist material for forming the second resist layer may comprise a conductive additive. The presence of the conductive additive imparts conductivity to the second resist layer, which can facilitate the flow-induced deformation of the second resist layer under the effects of the electric fields formed between the first and second substrates. The resist material may be any suitable resist material known to a person of ordinary skill in the art, including, but are not limited to, an acrylate-based resin and an epoxy-based resin. The viscosity of the resist material is not particularly limited, and may be any suitable viscosity depending on use. For example, in some embodiments, the viscosity of the resist material may be 300 cP.

The resist material may comprise a photoinitiator. In some embodiments, the photoinitiator comprises a metal. The photoinitiator may be any suitable photoinitiator known to a person of ordinary skill in the art, so long as the photoinitiator is capable of imparting conductivity to the resist material. Suitable photoinitiators include, but are not limited to, 2-hydroxy-2-methylproplophenone, phenyl bis(2,4,6-trimethylbenzoyl)phosphine oxide, ethyl (2,4,6-trimethylbenzoyl) phenylphosphinate, diphenyl (2,4,6-trimethylbenzoyl)phosphine oxide, and the like. The content of the photoinitiator in the resist material may be 0.3% to 1% by weight.

Other additives such as an organosilicon polymer, a solvent, a conductive dopant, and the like may be added to the resist material to promote flow-induced deformation of the second patterned layer. The solvent may be any suitable solvent known to a person of ordinary skill in the art, including, but is not limited to, ethyl lactate, toluene, propylene glycol methyl ether acetate (PGMEA), and the like.

In some embodiments, the resist material may comprise a mixture of aliphatic urethane diacrylate and bisphenol A epoxy acrylate, silver nanopowder flakes or ring-shaped silver nanopowder, and a photoinitiator. In some embodiments, the resist material may comprise acrylate-based resin and/or epoxy-based resin, a photoinitiator containing heavy metal ions, organometallic substances, and carbon black. In some embodiments, the resist material may comprise acrylate-based resin or poly(urethane acrylate) (PUA), a photoinitiator, and a conductive dopant such as carbon black, oxidized carbon black, or acetylene black.

Figure 9:
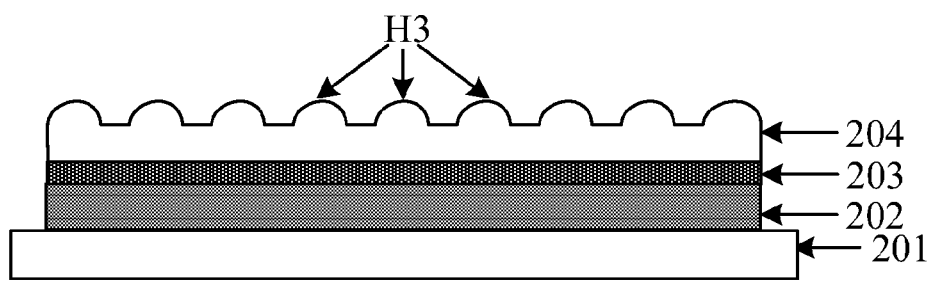
FIG. 9 shows a schematic diagram of a second substrate according to an embodiment of the present disclosure, which second substrate comprises a second resist layer.

FIG. 9 shows a schematic diagram of a second substrate according to an embodiment of the present disclosure, which second substrate comprises a second resist layer. As shown in FIG. 9, the second electrode layer 202, the second intermediate layer 203, and the second resist layer 204 are arranged in this order in a stack on the second base layer

201. A plurality of second convex portions H3 are formed on the surface of the second resist layer 204 that is farthest from the second base layer 201. FIGS. 7 and 9 show that the pattern of the plurality of second convex portions H3 (FIG. 9) corresponds to the pattern of the plurality of first convex portions H2 (FIG. 7). Each of the plurality of second convex portions H3 is aligned with one of the plurality of first convex portions H2. The plurality of first convex portions overlap entirely with the plurality of second convex portions. The orthographic projections of the plurality of first convex portions on the second base layer overlap entirely with the orthographic projections of the plurality of the second convex portions on the second base layer.

In step 205, the first base layer, the first electrode layer, and the dielectric layer are arranged to be directly opposite of the second base layer, the second electrode layer, and the second resist layer. The first and second substrates are arranged so that the plurality of first convex portions on the dielectric layer are aligned with the plurality of second convex portions on the second resist layer. Each of the first convex portions is aligned with one of the second convex portions, and vice versa. Each of the first convex portions corresponds in position to one of the second convex portions.

The first convex portions and the second convex portions are spaced apart by a predetermined distance. In some embodiments, the first convex portions and the second convex portions are spaced apart before electrical signals are supplied to the first electrode and the second electrode layer. The plurality of first convex portions and the plurality of second convex portions may be separated by a distance of 200 nm to 200 μm. However, the distance separating the first and second convex portions is not particularly limited, and may be determined based on factors such as the dimensions of the imprint patterns to be formed, the materials forming the second resist layer, and/or the electrical voltage to be applied to the first and second electrode layers. The separation distance may also be adjusted to minimize the amount of resist material residues between the first and second convex portions following the flow-induced formation of the imprint pattern. Minimizing, or altogether avoiding, resist material residues between the first and second convex portions obviates the need for additional processing steps (for example, residue removal steps) during the manufacturing process of devices incorporating the imprint pattern (for example, semiconductor or display panel). This can in turn improve productivity.

In step 206, electrical signals are supplied to each of the first electrode layer and the second electrode layer. The electrical signals cause electric fields to be produced between the first and second convex portions. The electric fields in turn induce the second resist layer to undergo flow-induced deformation, during which the plurality of second convex portions on the second resist layer elongate and extend toward the first substrate, make contact with a surface of a corresponding one of the plurality of first convex portions, and form an imprint pattern on the second substrate.

More particularly, electrical signals are supplied to each of the first electrode layer and the second electrode layer, which cause non-uniform electric fields to form between the first and second convex portions. The electric fields induce the second convex portions to undergo flow-induced deformation to elongate to extend toward the first convex portions. The electrical signals are terminated upon contact between the first and second convex portions, and an imprint pattern is formed on the second substrate. In some embodiments, the electrical signals are supplied as DC voltage. In some embodiments, the electrical signals are supplied as direct current voltage of from 5 V to 100 V.

The dielectric layer on the first substrate is thicker at positions corresponding to the first convex portions than at positions without the first convex portions. As a result, the electric fields at positions corresponding to the first convex portions are more intense, and the electric field strengths are stronger. Conversely, the electric fields at positions that do not correspond to a first convex portion are less intense, and the electric field strengths are weaker. Resist materials between adjacent second convex portions are subject to the weaker electric fields, because those resist materials are not aligned with one or more of the first convex portions. In contrast, resist materials in the second convex portions are subject to the stronger electric fields, because the second convex portions are aligned with the first convex portions. As a result, resist materials in the second convex portions are able to extend toward the corresponding first convex portions, and in the process, form the imprint pattern.

In some embodiments, the magnitude of the electrical signals supplied to the first and second electrode layers may be adjusted depending on the dimensions and/or geometry of the desired imprint pattern. For example, the electrical signals may be adjusted to achieve the desired thickness of resist materials between adjacent second convex portions, which may reduce or eliminate resist material residues. Minimizing, or altogether avoiding, resist material residues between adjacent second convex portions makes it possible to forgo additional processing steps (for example, residue removal steps) during the manufacturing process of devices incorporating the imprint pattern (for example, semiconductor or display panel). This can in turn improve productivity.

In some embodiments, after the termination of the electrical signals, the imprint pattern on the second substrate is cured, so as to stabilize the imprint pattern. After the imprint pattern on the second substrate is cured, the first substrate is removed to isolate the patterned second substrate and obtain the imprint template.

Figure 10:
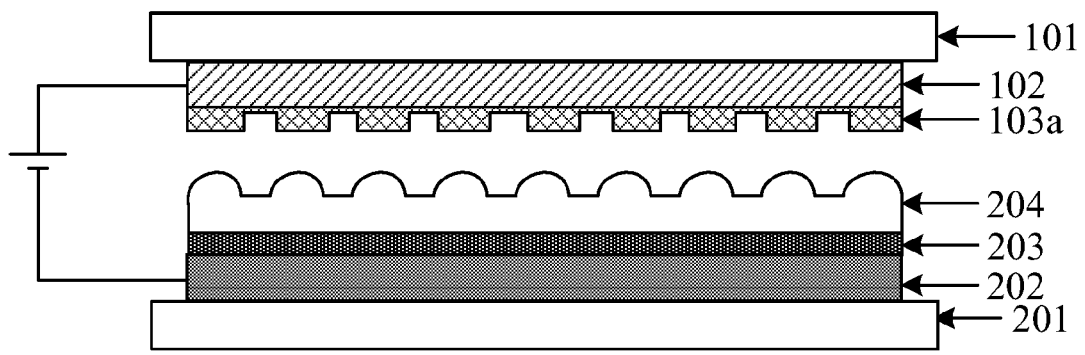
FIG. 10 shows a schematic diagram illustrating the state of an imprint assembly according to an embodiment of the present disclosure when electric signals are supplied to each of the first electrode layer of the first substrate and the second electrode layer of the second substrate.

FIG. 10 shows a schematic diagram illustrating the state of an imprint assembly according to an embodiment of the present disclosure when electric signals are beginning to be supplied to each of the first electrode layer of the first substrate and the second electrode layer of the second substrate.

As shown in FIG. 10, the first electrode layer 102 is formed on the first base layer 101. The first electrode layer 102 is a planar electrode having a smooth surface. The dielectric layer 103a is formed on the first electrode layer 102. A plurality of first convex portions are formed in a surface of the dielectric layer 103a that is farthest from the first base layer 101.

The second electrode layer 202 is formed on the second base layer 201. The second intermediate layer 203 is formed on the second electrode layer 202. The second resist layer 204 is formed on the second intermediate layer 203. A plurality of second convex portions are formed in a surface of the second resist layer 204 farthest from the second base layer 201.

The first base layer 101 and the second base layer 201 are arranged to be directly opposite of each other. The plurality of first convex portions and the plurality of second convex portions are aligned, and are separated by a predetermined distance. The plurality of first convex portions overlap entirely with the plurality of second convex portions. The orthographic projections of the plurality of first convex portions on the second base layer overlap entirely with the orthographic projections of the plurality of the second convex portions on the second base layer.

Figure 11:
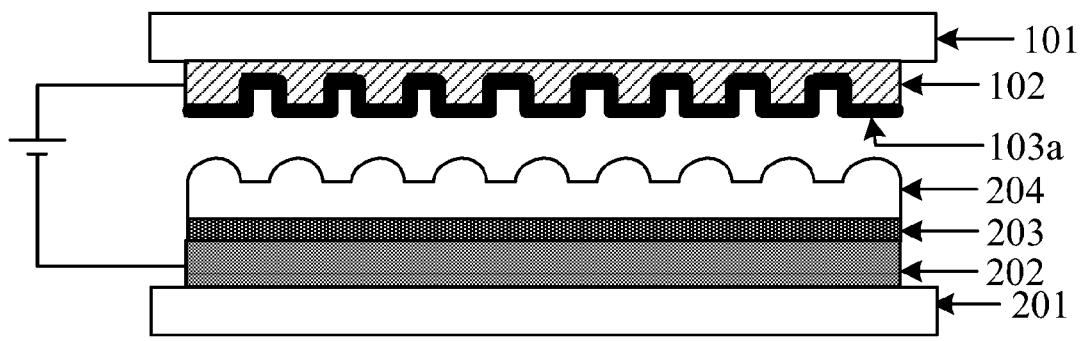
FIG. 11 shows a schematic diagram illustrating the state of an imprint assembly according to another embodiment of the present disclosure when electric signals are supplied to each of the first electrode layer of the first substrate and the second electrode layer of the second substrate.

FIG. 11 shows a schematic diagram illustrating the state of an imprint assembly according to another embodiment of the present disclosure when electric signals are beginning to be supplied to each of the first electrode layer of the first substrate and the second electrode layer of the second substrate.

As shown in FIG. 11, a plurality of fourth convex portions are formed on a surface of the first electrode layer 102. The dielectric layer 103a is formed on the first electrode layer 102. The plurality of fourth convex portions and the plurality of second convex portions are aligned, and are separated by a predetermined distance.

Figure 12:
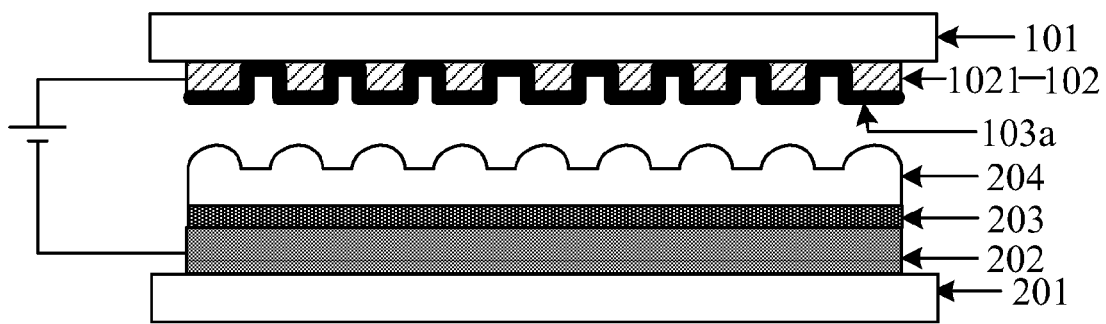
FIG. 12 shows a schematic diagram illustrating the state of an imprint assembly according to another embodiment of the present disclosure when electric signals are supplied to each of the first electrode layer of the first substrate and the second electrode layer of the second substrate.

FIG. 12 shows a schematic diagram illustrating the state of an imprint assembly according to another embodiment of the present disclosure when electrical signals are beginning to be supplied to each of the first electrode layer of the first substrate and the second electrode layer of the second substrate.

As shown in FIG. 12, the first electrode layer 102 comprises a plurality of electrode blocks 1021. The dielectric layer 103a is formed on the first electrode layer 102 and the electrode blocks 1021. The plurality of electrode blocks and the plurality of second convex portions are aligned, and are separated by a predetermined distance.

Figure 13:
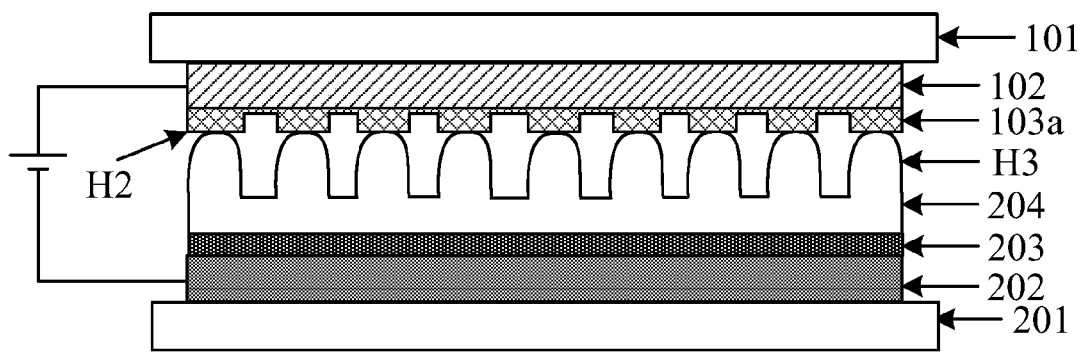
FIG. 13 shows a schematic diagram of an imprint assembly according to an embodiment of the present disclosure.

FIG. 13 shows a schematic diagram of an imprint assembly according to the embodiment illustrated in FIG. 10.

As shown in FIG. 13, each of the plurality of second convex portions H3 is in contact with the corresponding first convex portion H2.

Steps 201 to 206 described above are based on embodiments in which the second resist layer is formed with a plurality of second convex portions, and the plurality of second convex portions are induced under the effects of electrical fields between the first and second substrates to flow to form the desired imprint pattern. However, the present disclosure is not limited to these embodiments. For example, in some embodiments, the plurality of second convex portions are not formed in the second resist layer. In such embodiments, the second resist layer has a smooth surface. As long as the thickness of the first electrode layer is not uniform, electric fields of varying strengths may be formed between the first and second substrates, and the electric fields may induce the second patterned layer to undergo flow-induced deformation to form the desired imprint pattern. The first electrode layer may be formed in any manner described in the present disclosure.

The present disclosure provides a method of forming an imprint template.

A first substrate and a second substrate are positioned to be directly opposite of each other. A first electrode layer and a plurality of first convex portions are formed on the first base layer. A second electrode layer and a second resist layer are formed on the second base layer. A plurality of second convex portions are formed on a surface of the second resist layer farthest from the second base layer. The plurality of first convex portions and the plurality of second convex portions are aligned with each other. Each of the plurality of first convex portions is aligned with one of the plurality of second convex portions. The plurality of first convex portions and the plurality of second convex portions are separated by a predetermined distance.

Electrical signals are supplied to each of the first electrode layer and the second electrode layer, which causes electric fields to be generated between the first and second convex portions. The electric fields induce the second convex portions to undergo deformation to form the desired imprint pattern on the second substrate.

As compared to conventional nanoimprint technologies, the present disclosure utilizes a flow-induced formation process to produce the imprint pattern. The precision of the imprint pattern produced by the flow-induced formation process does not depend on the closeness of fit between the mold and the imprint substrate. As a result, the present disclosure makes it possible to minimize, even eliminate, the effects of a mold's dimensions and geometry on the structure of the imprint pattern. This in turn can increase the precision and accuracy of the imprint pattern.

The present disclosure also provides an imprint template. The imprint template is as described above, and is produced by a method according to embodiments of the present disclosure.

The present disclosure also provides an imprint mold for fabricating an imprint template. The imprint mold comprises a first substrate, a first electrode layer on the first substrate, and a plurality of first convex portions.

In some embodiments, the plurality of first convex portions are aimed on a surface of the first electrode layer that is farthest away from the first base layer. In some embodiments, the imprint mold may further comprise a dielectric layer on the first electrode layer, and the plurality of first convex portions are formed in a surface of the dielectric layer that is farthest away from the first base layer.

The pattern of the plurality of first convex portions corresponds to a pattern of convex portions on a substrate to be imprinted. For example, the substrate to be imprinted may comprise the second base layer and the second resist layer. A plurality of second convex portions may be formed on a surface of the second resist layer that is farthest from the second base layer. The first substrate and the second substrate are positioned to be directly opposite of each other and so that the plurality of first convex portions and the plurality of second convex portions are aligned. Each of the plurality of first convex portions is aligned with one of the plurality of second convex portions. When electric signals are supplied to the first and second electrode layers, electric fields are generated between the first and second convex portions. The electric fields induce the plurality of second convex portions on the second resist layer to deform to form the imprint pattern on the second substrate.

The present disclosure also provides an apparatus for performing a method of fabricating an imprint template. The imprint template may be as described above. The method of fabricating the imprint template may be as described above.

The apparatus may comprise a controller, a fabrication unit coupled to the controller, and a positioning unit coupled to the controller.

The fabrication unit is configured to form the component layers (for example, first electrode layer and dielectric layer) on the first base layer, and the component layers (for example, second electrode layer and second resist layer) on the second base layer. The structure and configuration of the fabrication unit are not particularly limited. It is understood that the fabrication unit may have any suitable structure and configuration known to a person of ordinary skill in the art, depending on need and/or the process by which each component layer is to be fabricated.

The positioning unit is configured to position the first and second substrates in such a manner that the plurality of first convex portions on the first substrate and the plurality of second convex portions on the second substrate are aligned and separated by a predetermined distance.

The positioning unit comprises a first stage configured to hold and support the first substrate, a second stage configured to hold and support the second substrate, a first actuating arm that is coupled to the first stage, and a second actuating arm that is coupled to the second stage. The first actuating arm and the second actuating arm are configured to rotate the first and second stages, respectively, and/or move the first and second stages in a horizontal and/or vertical direction. The positioning unit further comprises a first stage driver is coupled to the first actuating arm, and is configured to drive the vertical movement of the first stage. A second stage driver is coupled to the second actuating arm, and is configured to drive the vertical movement of the second stage. The first actuating arm, the first stage driver, the second actuating arm, and the second stage driver are each coupled to the controller, which is configured to rotate and/or move the first and second stages to align the first substrate (and the plurality of first convex portions) and the second substrate (and the plurality of second convex portions). The positioning unit may further comprise a sensor for detecting the positions and the alignment of the first and second substrates on the first and second stages, respectively. Based on the information on the detected positions and alignment of the first and second substrates, the controller may control the actuating arms and/or the stage drivers to adjust the positions of the first stage and/or second stage.

In some embodiments, the apparatus may further comprise a holder. The holder is configured to secure the first substrate to the first stage, and the second substrate to the second stage. The structure and configuration of the holder are not particularly limited. It is understood that the holder may have any suitable structure and configuration known to a person of ordinary skill in the art, so long as it is capable of securing the first substrate to the first stage and the second substrate to the second stage.

The controller is configured to control the operations of the fabrication unit, the operation of the positioning unit, and the operation of the holder. The structure and configuration of the controller are not particularly limited. It is understood that the holder may have any suitable structure and configuration known to a person of ordinary skill in the art. The controller may be a central processing unit (CPU), a field-programmable gate array (FPGA), a microcontroller (MCU), a digital signal processor (DSP), an application specific integrated circuit (ASIC), or other logic devices with data processing capability and/or program execution capability.

In the description of the specification, references made to the term "some embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples. In addition, for a person of ordinary skill in the art, the disclosure relates to the scope of the present disclosure, and the technical scheme is not limited to the specific combination of the technical features, and also should cover other technical schemes which are formed by combining the technical features or the equivalent features of the technical features without departing from the inventive concept. What is more, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A method for fabricating an imprint template, comprising:
   providing a first substrate comprising a first electrode layer on a first base layer and a plurality of first convex portions on a surface of the first electrode layer;
   providing a second substrate comprising a second electrode layer on a second base layer, a resist layer on the second electrode layer, and a plurality of second convex portions on a surface of the resist layer farthest from the second base layer;
   supplying electrical signals to the first electrode layer and the second electrode layer to produce an electric field between the plurality of first convex portions and the plurality of second convex portions; and
   forming the imprint template on the second substrate,
   wherein the plurality of first convex portions are positioned to face the plurality of second convex portions,
   wherein each of the plurality of first convex portions is aligned with a corresponding one of the plurality of second convex portions, and
   wherein the plurality of first convex portions and the plurality of second convex portions are spaced apart by a predetermined distance,
   wherein, before the supplying of electrical signals to the first electrode layer and the second electrode layer to produce the electric field between the plurality of first convex portions and the plurality of second convex portions, the plurality of first convex portions are spaced apart from the plurality of second convex portions.

2. The method according to claim 1, wherein the method comprises, during the forming of the imprint template, elongating each of the plurality of second convex portions to extend toward a corresponding one of the plurality of first convex portions and contacting with a surface of the corresponding one of the plurality of first convex portions.

3. The method according to claim 1, wherein the plurality of first convex portions are positioned to overlap entirely with the plurality of second convex portions.

4. The method according to claim 1, wherein the resist layer comprises a resist material having a rheological property.

5. The method according to claim 1, wherein the resist layer comprises an ultraviolet-curable resist material, a photoinitiator, and an additive.

6. The method according to claim 5,
wherein the ultraviolet-curable resist material comprises at least one of an acrylate-based resin and an epoxy-based resin,
wherein the photoinitiator comprises a metal, and
wherein a content of the photoinitiator is from 0.3 to 1% by weight of the ultraviolet-curable resist material.

7. The method according to claim 1, wherein each of the first base layer and the second base layer comprises a rigid or semi-rigid transparent material.

8. The method according to claim 2, further comprising supplying the electrical signals until the plurality of first convex portions and the plurality of second convex portions contact each other, and then curing the plurality of second convex portions.

9. The method according to claim 1, wherein the providing of the second substrate comprises forming the second electrode layer on the second base layer, applying a layer of resist material on the second electrode layer, and patterning and curing the layer of resist material to form the resist layer.

10. The method according to claim 1, wherein the providing of the first substrate comprises:
forming the first electrode layer on the first base layer,
patterning the first electrode layer to form a plurality of electrode blocks, and
forming the plurality of first convex portions on the plurality of electrode blocks so that each of the plurality of first convex portions corresponds to one of the plurality of electrode blocks.

11. The method according to claim 1, wherein the providing of the first substrate comprises:
forming the first electrode layer on the first base layer,
forming a dielectric layer on the first electrode layer,
forming a first resist layer on the dielectric layer,
forming a plurality of third convex portions on a surface of the first resist layer,
forming the plurality of first convex portions in the dielectric layer using the plurality of third convex portions as a mask, and
removing the first resist layer and the plurality of third convex portions.

12. The method according to claim 8, further comprising forming a first intermediate layer on the second electrode layer before applying the layer of resist material,
wherein the first intermediate layer comprises a primer material, and
wherein the first intermediate layer has a thickness of 5 nm to 10 nm.

13. The method according to claim 1, wherein the electrical signals are supplied as direct current voltage of from 5 V to 100 V.

14. The method according to claim 1, further comprising separating the second substrate comprising the imprint template formed thereon from the first substrate.

15. An imprint template obtained by the method of claim 1.

* * * * *